(12) United States Patent
Ikeda

(10) Patent No.: US 7,795,706 B2
(45) Date of Patent: Sep. 14, 2010

(54) STACKED MEMORY WITHOUT UNBALANCED TEMPERATURE DISTRIBUTIONS

(75) Inventor: Hiroaki Ikeda, Tokyo (JP)

(73) Assignee: Elpida Memory, Inc., Chuo-ku, Tokyo (JP)

( * ) Notice: Subject to any disclaimer, the term of this patent is extended or adjusted under 35 U.S.C. 154(b) by 111 days.

(21) Appl. No.: 12/219,429

(22) Filed: Jul. 22, 2008

(65) Prior Publication Data

US 2009/0045526 A1 Feb. 19, 2009

(30) Foreign Application Priority Data

Jul. 23, 2007 (JP) ............... 2007-190716

(51) Int. Cl.
H01L 29/40 (2006.01)
H01L 23/02 (2006.01)
(52) U.S. Cl. ...................... 257/621; 257/686
(58) Field of Classification Search .......... 257/621, 257/686
See application file for complete search history.

(56) References Cited

U.S. PATENT DOCUMENTS

| | | | |
|---|---|---|---|
| 7,099,173 B2 * | 8/2006 | Koide ................... | 365/51 |
| 7,123,497 B2 * | 10/2006 | Matsui et al. .............. | 365/51 |
| 7,464,225 B2 * | 12/2008 | Tsern .................... | 711/115 |
| 7,489,030 B2 * | 2/2009 | Shibata et al. ............ | 257/686 |
| 7,531,905 B2 * | 5/2009 | Ishino et al. ............. | 257/777 |
| 7,576,433 B2 * | 8/2009 | Ishino et al. ............. | 257/777 |
| 7,633,785 B2 * | 12/2009 | Kim et al. ............... | 365/51 |

FOREIGN PATENT DOCUMENTS

JP 2005-44463 2/2005

* cited by examiner

Primary Examiner—Luan C Thai
(74) Attorney, Agent, or Firm—McGinn IP Law Group, PLLC

(57) ABSTRACT

A stacked memory without unbalanced temperature distributions is disclosed. According to one aspect of the invention, a through electrode in each layer is connected one after the other such that regions to be activated in neighboring layers do not overlap in a vertical direction. According to another aspect of the invention, each layer comprises an activation region distribution circuit for outputting an activation signal to, among the regions of the layer, a region having an address different from an address of a region to be activated in a layer adjacent to the layer in question.

10 Claims, 5 Drawing Sheets

STACKED MEMORY WITHOUT UNBALANCED TEMPERATURE DISTRIBUTIONS

BACKGROUND OF THE INVENTION

1. Technical Field

The present invention relates to a stacked memory wherein thin chips are stacked and a specified region in each layer is activated using an address signal which passes through a through electrode in each layer.

2. Related Art

In a stacked memory having components that are high-density mounted by stacking chips, an operation is considered in which a specified region is accessed in a concentrated manner. For example, as shown in FIGS. 1A and 1B, when each layer is simultaneously activated using a common address, if mat regions having a common through electrode are to be activated, there arise unbalanced temperature distributions among the layers, thus causing variations in characteristics accompanied by distortions due to heat and stress differences among the stacked chips. These become significant by making chips further thinner in accordance with requirements for higher integration of memory chips to be stacked as shown in FIG. 1C, and by the increase of operating power that results from higher functionality of the chips.

JP2005-44463A proposes providing a semiconductor device with low power consumption and low heating value by activating memory cells block by block which is a portion of the memory area.

SUMMARY OF THE INVENTION

It is an object of the present invention to provide a stacked memory in which unbalanced temperature distributions caused by the operation of a specified region and variations in characteristics attendant thereon are effectively eliminated.

According to a first aspect of the invention, a through electrode in each layer is connected one after the other such that regions to be activated in neighboring layers do not overlap in a vertical direction.

Since regions to be activated are distributed among the layers, temperature differences of the interface between the stacked memory chips caused by the influence of heat generation are reduced and variations in the characteristics of memory chips are also reduced.

According to a second aspect of the invention, each layer comprises an activation region distribution circuit for outputting an activation signal to, among the regions of the layer, a region having an address different from an address of a region to be activated in a layer adjacent to the layer in question.

By distributing an address to specify a region to be activated, by means of the activation region distribution circuit provided on each layer, temperature differences of the interface between the stacked memory chips caused by the influence of heat generation are reduced and variations in the characteristics of memory chips are also reduced.

The above and other objects, features and advantages of the present invention will become apparent from the following description with reference to the accompanying drawings which illustrate examples of the present invention.

EXEMPLARY EMBODIMENTS

1st Exemplary Embodiment

Figure 1:
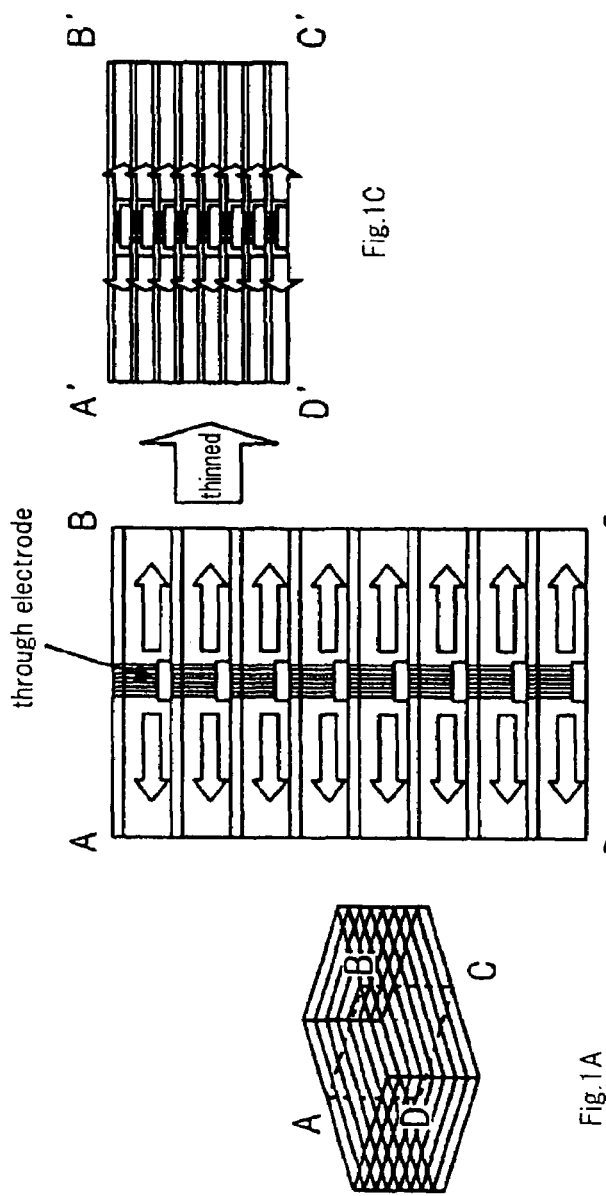
FIG. 1A is a diagrammatic perspective view of a stacked memory.
FIG. 1B is a cross-sectional view of FIG. 1A taken along line A-B-C-D.
FIG. 1C is a view of a stacked memory obtained from thinning the stacked memory shown in FIG. 1B.
Figure 2:
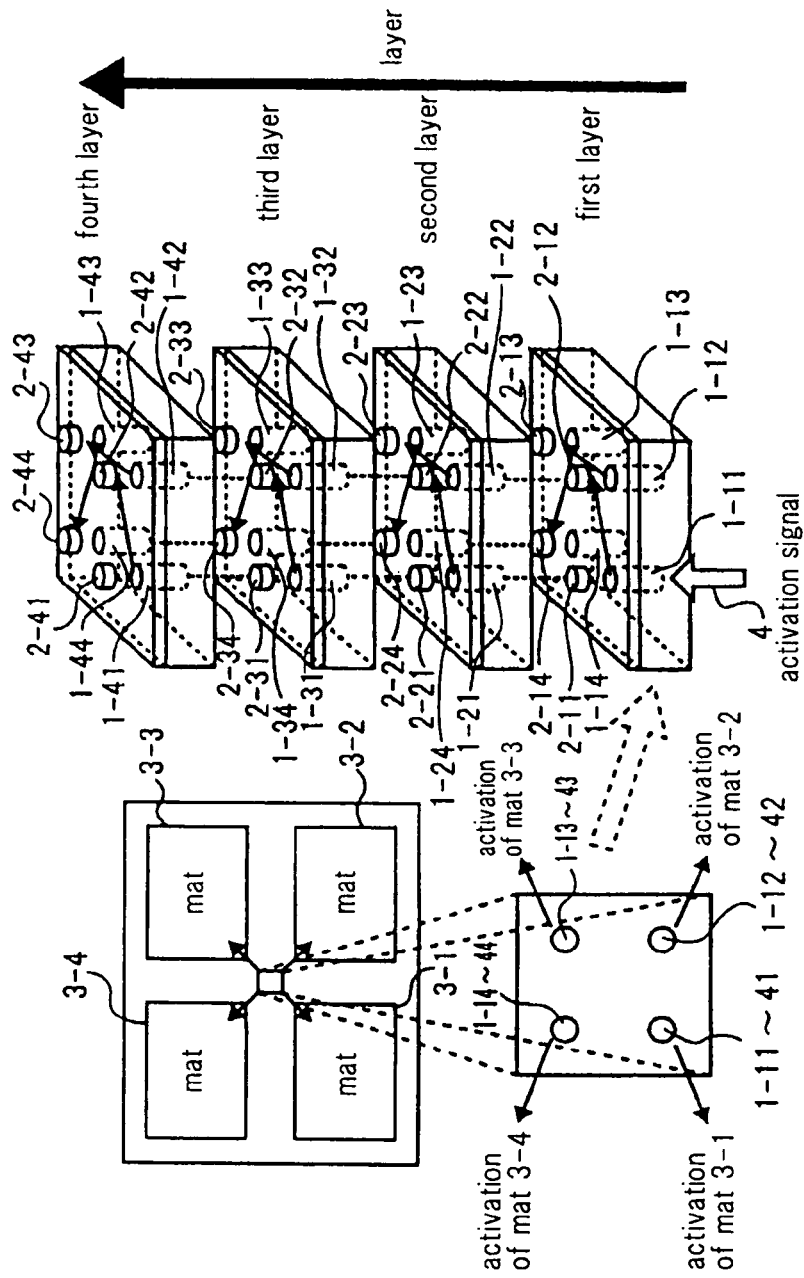
FIG. 2 is a view of a stacked memory according to a first embodiment of the present invention.

FIG. 2 illustrates a stacked memory according to a first exemplary embodiment of the present invention.

The stacked memory according to the present embodiment is made up of four layers: a first layer, a second layer, a third layer, and a fourth layer. As shown in FIG. 2B, the first layer includes through electrodes 1-11 to 1-14 and bumps (protrusion electrodes) 2-11 to 2-14 formed thereon. Similarly, the second layer includes through electrodes 1-21 to 1-24 and bumps 2-21 to 2-24 formed thereon, the third layer includes through electrodes 1-31 to 1-34 and bumps 2-31 to 2-34 formed thereon, and the fourth layer includes through electrodes 1-41 to 1-44 and bumps 2-41 to 2-44 formed thereon. In the first layer, through electrodes 1-11, 1-12, 1-13, and 1-14 are electrically connected with bumps 2-12, 2-13, 2-14, and 2-11, respectively, by wires (not shown), and bumps 2-12, 2-13, 2-14, and 2-11 are connected with through electrodes 1-22, 1-23, 1-24, and 1-21 in the second layer, respectively. In the second layer, through electrodes 1-21, 1-22, 1-23, and 1-24 are electrically connected with bumps 2-22, 2-23, 2-24, and 2-21, respectively, by wires (not shown), and bumps 2-22, 2-23, 2-24, and 2-21 are connected with through electrodes 1-32, 1-33, 1-34, and 1-31 in the third layer, respectively. In the third layer, through electrodes 1-31, 1-32, 1-33, and 1-34 are electrically connected with bumps 2-32, 2-33, 2-34, and 2-31, respectively, by wires (not shown), and bumps 2-32, 2-33, 2-34, and 2-31 are connected with through electrodes 1-42, 1-43, 1-44, and 1-41 in the fourth layer, respectively.

As shown in FIG. 2A, in each layer, mats 3-1, 3-2, 3-3, and 3-4, which are operation regions, are disposed and each layer is activated by respective activation (address) signals 4 which pass through electrodes 1-11 to 1-41, 1-12 to 1-42, 1-13 to 1-43, and 1-14 to 1-44, respectively.

When activation signal 4 from the outside is input to through electrode 1-11 in the first layer, activation signal 4 first activates mat 3-1, and then via bump 2-12 flows into through electrode 1-22 in the second layer to activate mat 3-2, via bump 2-23 flows into through electrode 1-33 in the third layer to activate mat 3-3, and finally via bump 2-34 flows into through electrode 1-44 in the fourth layer to activate mat 3-4. That is, activation signal 4 flows into the through electrode in each layer in a spiral manner, sequentially activating mats 3-1, 3-2, 3-3, and 3-4. Since regions (mats) to be activated are thus dispersed among the layers, the differences in temperatures between the layered memory chips caused by the operation of the regions are decreased.

When mats 3-2, 3-3, 3-4, and 3-1 are activated in this order, activation signal 4 may be input to through electrode 1-12. When mats 3-3, 3-4, 3-1, and 3-2 are activated in this order, activation signal 4 may be input to through electrode 1-13. When mats 3-4, 3-1, 3-2, and 3-3 are activated in this order, activation signal 4 may be input to through electrode 1-14.

Although a plurality of through electrodes are needed in the present embodiment, the number of through electrodes may be fewer than the number of mats. In this case, a plurality of mats are activated by an activation signal flowing through the same through electrode.

2nd Exemplary Embodiment

Figure 3:
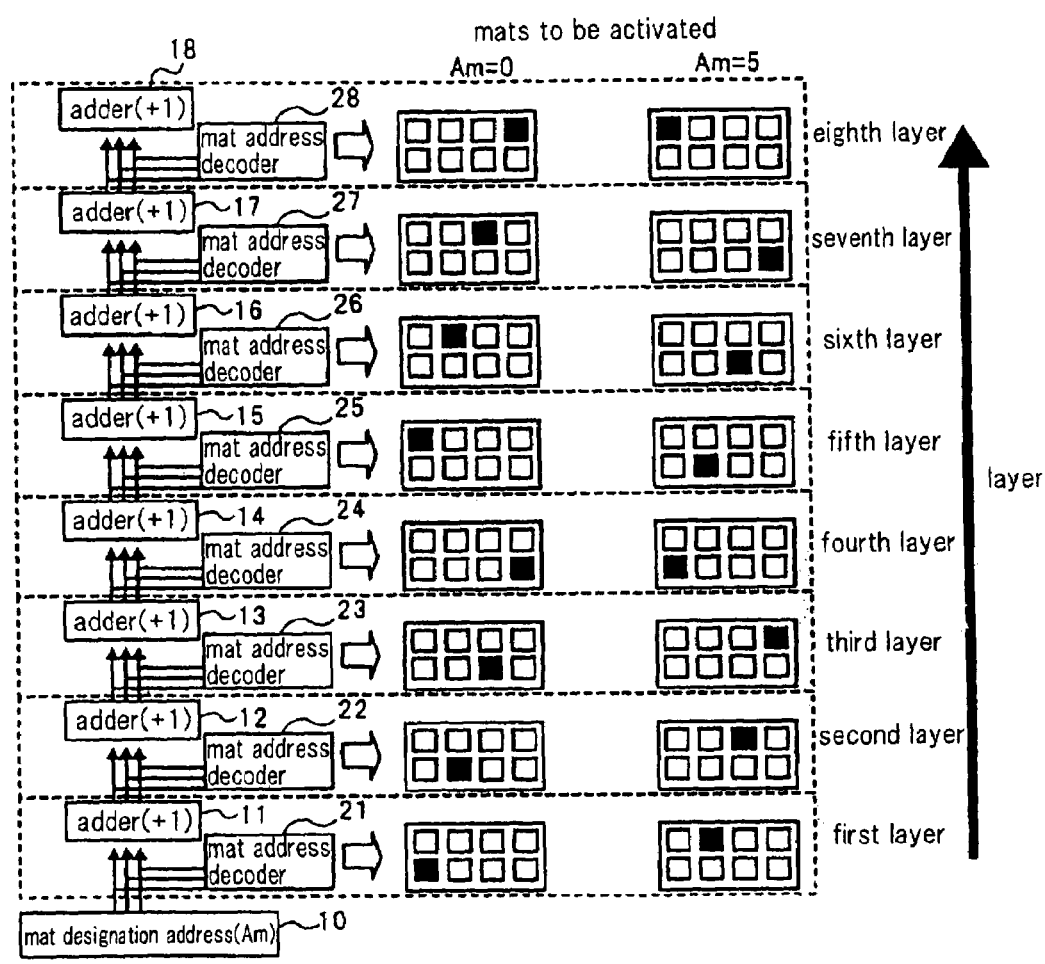
FIG. 3 is a view of a stacked memory according to a second embodiment of the present invention.

FIG. 3 illustrates a stacked memory according to a second exemplary embodiment of the present invention.

The stacked memory according to the present embodiment is made up of eight layers: a first layer, a second layer, ..., and an eighth layer. Each layer is provided with an activated mat dispersion circuit that comprises a respective adder 11 to 18 and a respective mat address decoder 21 to 28. Adder 11 increments mat designation address 10 input from the outside via a through electrode by +1, and outputs the added mat designation address to the activated mat dispersion circuit in the second layer. Mat address decoder 10 decodes mat designation address 10 and outputs an activation signal to a mat that is indicated by mat designation address 10. Adders 12 to 18 and mat address decoders 22 to 28 each perform the same operation to activate mats whose addresses for neighboring layers differ by one. The squares filled in with black in FIG. 3 illustrate examples (the mat designation address is 0 and 5) of mats to be activated. Adder 18 in the eighth layer may be dispensed with.

In this manner, mat designation address 10 is incremented by +1 between neighboring layers, and mats to be activated are dispersed among the layers. This enables allocating regions to be activated with a simple configuration in which mats to be activated do not overlap one another between neighboring layers even by one mat designation address.

In the present embodiment, "0" is input as mat designation address 10. However, subtractors to decrement mat designation address 10 by −1 may be provided in place of adders 11 to 18, and "7" may be input as mat designation address 10.

3rd Exemplary Embodiment

Figure 4:
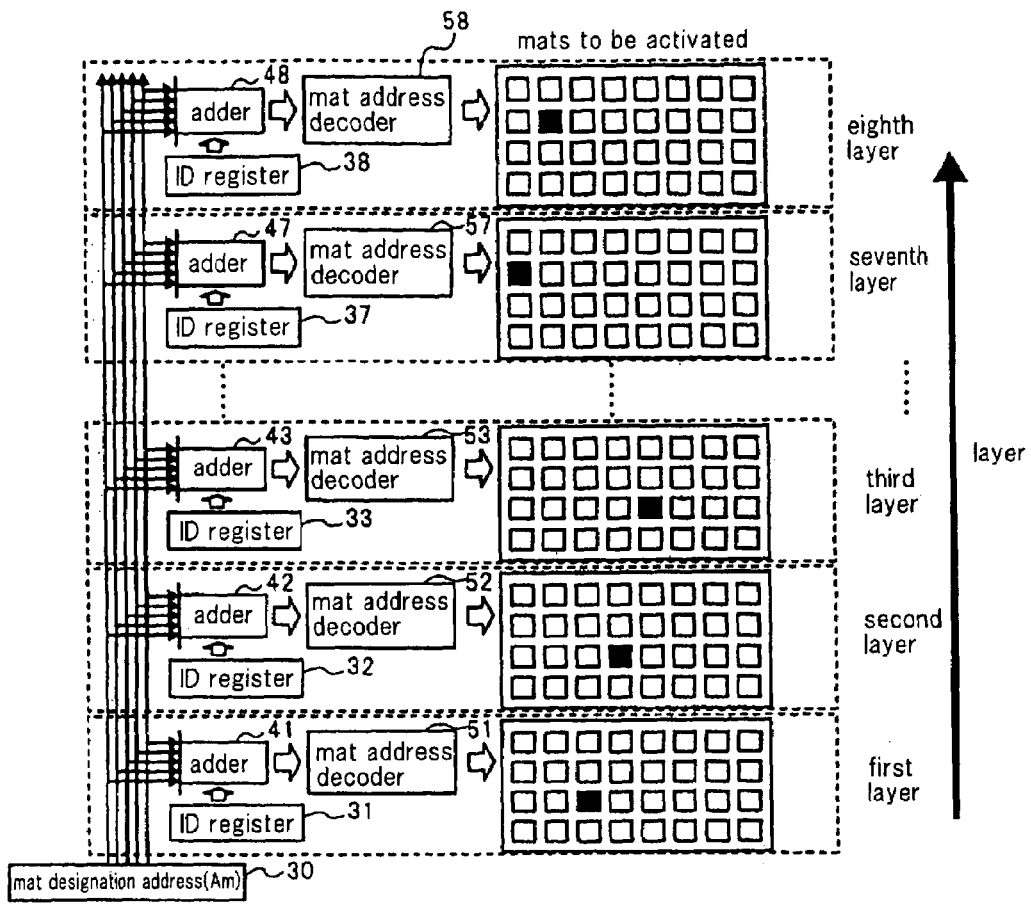
FIG. 4 is a view of a stacked memory according to a third embodiment of the present invention.

FIG. 4 illustrates a stacked memory according to a third exemplary embodiment of the present invention.

The stacked memory according to the present embodiment is made up of eight layers: a first layer, a second layer, ..., and an eighth layer. Each layer is provided with an activated mat dispersion circuit that comprises respective ID registers 31 to 38, respective adders 41 to 38, and mat address decoders 51 to 58. ID registers 31, 32, 33, ..., and 38 are each loaded with "0", "1", "2", ..., and "7" as layer identification numbers of the first, second, third, ..., and eighth layer. The layer identification numbers may be set by a serial connection of adders as shown in the second embodiment. Adders 41 to 48 each add mat designation address 30 input from the outside and the layer identification number loaded with respective ID registers 31 to 38 together. Mat address decoders 51 to 58 each decode mat designation address 30 which is an output of respective adders 41 to 48 and outputs an activation signal to a mat which is indicated by mat designation address 30. The squares filled in with black in FIG. 4 illustrate examples of mats to be activated.

In this manner, in the present embodiment, mat designation address 30 input from the outside is added to a layer identification number in each layer, thus dispersing mats to be activated among the layers. Similar to the second embodiment, this enables allocating regions to be activated with a simple configuration in which mats to be activated do not overlap one another between neighboring layers even by one mat designation address. It is to be noted that in the present embodiment, since mat designation address 30 from the outside is directly transmitted to the adder in each layer, a high speed operation that does not depend on the number of the layers is possible.

Although in the above-described embodiments, the mat designation address is first input to the lowest layer, it may be first input to the highest layer (the fourth layer in the first embodiment, and the eighth layer in the second and third embodiments).

Figure 5:
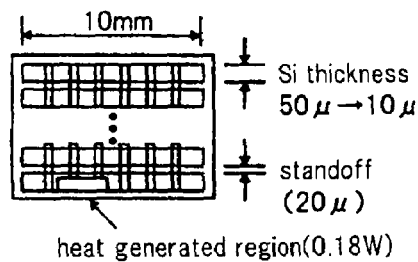
FIG. 5 is a view illustrating dimensions of a stacked memory which is used when measuring the inter-chip temperature differences.
Figure 6:
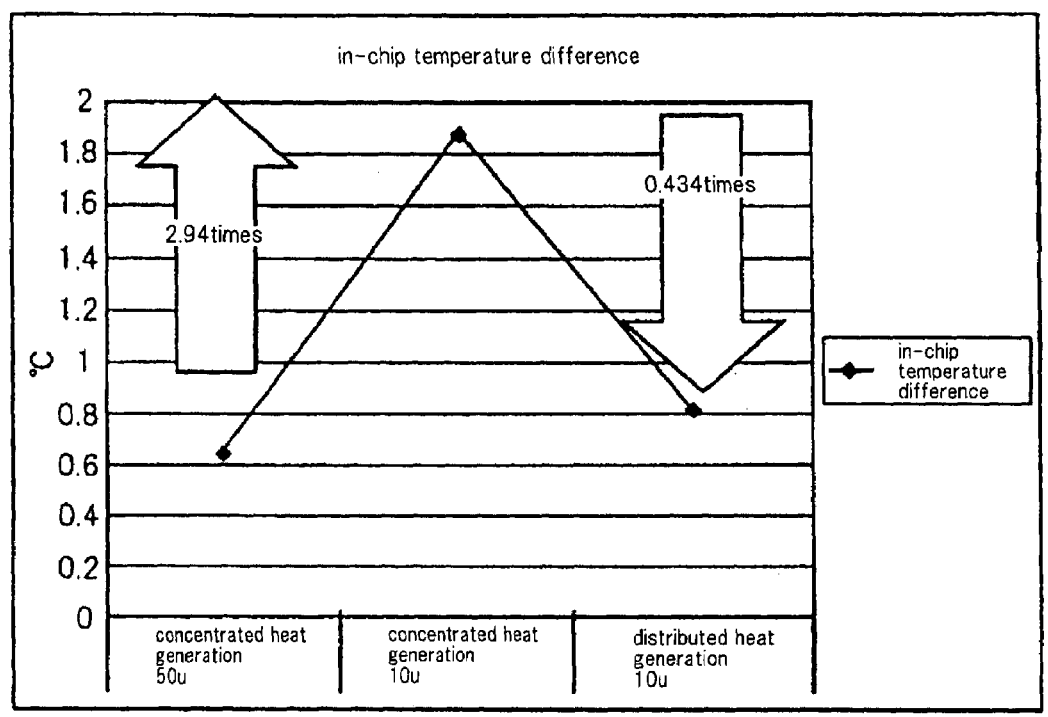
FIG. 6 is a graph showing an inter-chip temperature difference in the present invention versus an inter-chip temperature difference in the prior art.

FIG. 6 is a graph showing an inter-chip temperature difference in the present invention versus an inter-chip temperature difference in the prior art. As shown in FIG. 5, when thin memories with a chip thickness of 50μ were stacked with an adhesion layer of a thickness of 20μ interposed therebetween and an operating power having 0.18 W was generated in a particular region in the lowest layer in a concentrated manner, the inter-chip temperature difference in the stacked structure was on the order of 0.6° C. When the same operation was carried out on thin memories with a chip thickness of 10μ, which, in the future, are supposed to be of ultrahigh-density mounted structure, the inter-chip temperature difference was three times larger than in the case of the thin memories with a chip thickness of 50μ. This demonstrates that heat transfer in the silicon chip in the horizontal direction is aggravated due to the reduction of the thickness of the chip. When high speed access which will increase power consumption is performed, the inter-chip temperature difference is further increased with the increase of heat transfer resistance. In contrast, as in the present invention, if a region to be activated in each layer of a stacked memory was dispersed not to overlap one another between neighboring layers, the inter-chip temperature difference could be reduced by about one half even in the case of a chip having a thickness of 10μ (FIG. 5 and Table 1).

TABLE 1

| | thickness (μ) | | |
|---|---|---|---|
| | 50μ concentrated heat generation | 10μ concentrated heat generation | 10μ distributed heat generation |
| In-chip temperature difference | 0.64 | 1.89 | 0.82 |

While preferred embodiments of the present invention have been described using specific terms, such description is for illustrative purposes only, and it is to be understood that changes and variations may be made without departing from the spirit or scope of the following claims.

This application is based upon and claims the benefit of the priority from Japanese Patent Application No. 2007-190716 filed on Jul. 23, 2007.

What is claimed is:

1. A stacked memory, comprising:
thin chips which are stacked,
wherein a specified region in a layer of the thin chips is activated using an address signal which passes through a through electrode in the layer, and the through electrode in the layer is connected to a through electrode in an other layer of the thin chips which is adjacent to the layer such that the specified region to be activated in the layer does not overlap a region to be activated in the other layer in a vertical direction.

2. The stacked memory according to claim 1, wherein the through electrode in each layer of the thin chips is connected one after the other in a spiral manner.

3. A stacked memory, comprising:
thin chips which are stacked,
wherein a specified region in a layer of the thin chips is activated using an address signal which passes through a through electrode in the layer, and the layer comprises an activation region distribution circuit for outputting an activation signal to the specified region which has an address different from an address of a region to be activated in an other layer of the thin chips which is adjacent to the layer.

4. The stack memory according to claim 3, wherein said activation region distribution circuit includes:
a region address decoder for decoding the address signal and for outputting an activation signal to activate the specified region which is specified by the address signal; and
an adder or subtractor for incrementing the address signal by +1 or decrementing the address signal by −1, and for outputting the resultant address signal to the other layer which is adjacent to the layer.

5. The stacked memory according to claim 3, wherein said activation region distribution circuit includes:
an ID register for holding a value to identify the layer;
an adder for adding the value held in said ID register to the address signal and outputting a resultant address signal; and
a region address decoder for decoding the resultant address signal output from said adder to output an activation signal to activate the specified region which is specified by the resultant address signal.

6. A stacked memory comprising:
a plurality of chips stacked on each other in a vertical direction, each of said plurality of chips including a plurality of memory regions and receiving commonly an address signal to activate a specified memory region of said plurality of memory regions,
wherein a position in a horizontal direction of said specified memory region of a predetermined chip of said plurality of chips is different from a position in said horizontal direction of said specified memory region of a neighboring chip of said plurality of chips which is neighboring to said predetermined chip.

7. The stacked memory according to claim 6, wherein each of said plurality of chips includes a through electrode to receive said address signal.

8. The stacked memory according to claim 7, wherein said through electrode in each of said plurality of chips is coupled one after the other in a spiral manner.

9. The stacked memory according to claim 6, wherein the predetermined chip includes an activation region distribution circuit to output an activation signal to the specified memory region of the predetermined chip, the specified memory region of the predetermined chip including an address different from an address of the specified memory region to be activated in the neighboring chip.

10. The stacked memory according to claim 9, wherein said activation region distribution circuit includes an ID register that holds a value to identify said predetermined chip, an adder that adds the value held in said ID register to the address signal and outputting a resultant address signal, and a region address decoder that decodes the resultant address signal output from said adder to output an activation signal to activate the specified region which is specified by the resultant address signal.

* * * * *